United States Patent [19]

Gallant

[11] 4,085,404

[45] Apr. 18, 1978

[54] PHASING OPTIMIZATION AT THE FEED PROBES OF A PARALLEL PLATE LENS ANTENNA

[75] Inventor: Janice Anne Gallant, Edgewood, Md.

[73] Assignee: The Bendix Corporation, Southfield, Mich.

[21] Appl. No.: 752,658

[22] Filed: Dec. 20, 1976

[51] Int. Cl.² ............................................. H01Q 14/06
[52] U.S. Cl. ...................................... 343/754; 343/854
[58] Field of Search ................ 343/854, 754, 753, 853

[56] References Cited

U.S. PATENT DOCUMENTS

| | | | |
|---|---|---|---|
| 3,761,936 | 9/1973 | Archer et al. | 343/854 |
| 3,827,055 | 7/1974 | Bogner et al. | 343/754 |
| 3,852,761 | 12/1974 | Bogner | 343/754 |
| 3,940,770 | 2/1976 | Fassett et al. | 343/754 |
| 3,964,069 | 6/1976 | McDonough | 343/854 |
| 3,979,754 | 9/1976 | Archer | 343/854 |

Primary Examiner—Alfred E. Smith
Assistant Examiner—David K. Moore
Attorney, Agent, or Firm—W. G. Christoforo; Bruce L. Lamb

[57] ABSTRACT

In a microwave lens antenna of the parallel plate type for scanning a beam wherein a plurality of feed probes spaced along the focal arc are simultaneously excited in groups in accordance with weighting functions, the phases of the feed probes are optimized by predetermination of the lengths of the coaxial cables supplying energy to the feed probes.

6 Claims, 5 Drawing Figures

U.S. Patent  April 18, 1978  4,085,404
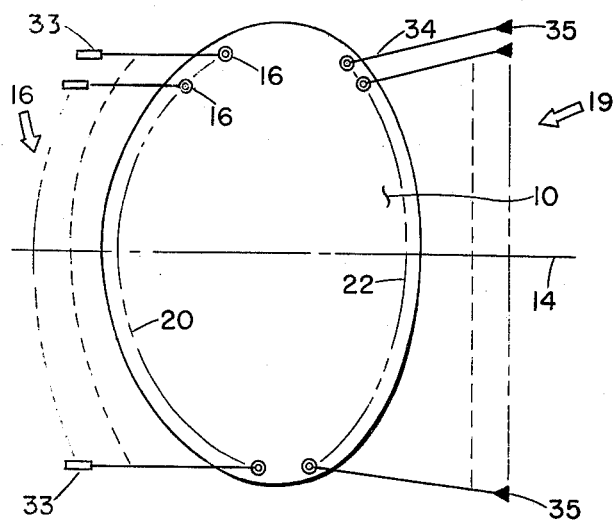
FIG. 1
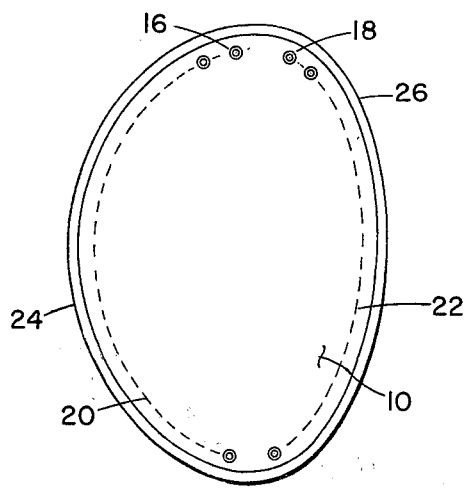
FIG. 3
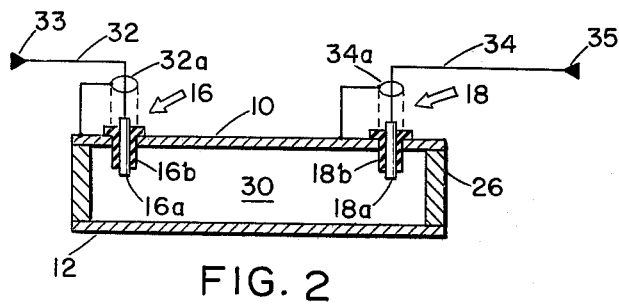
FIG. 2
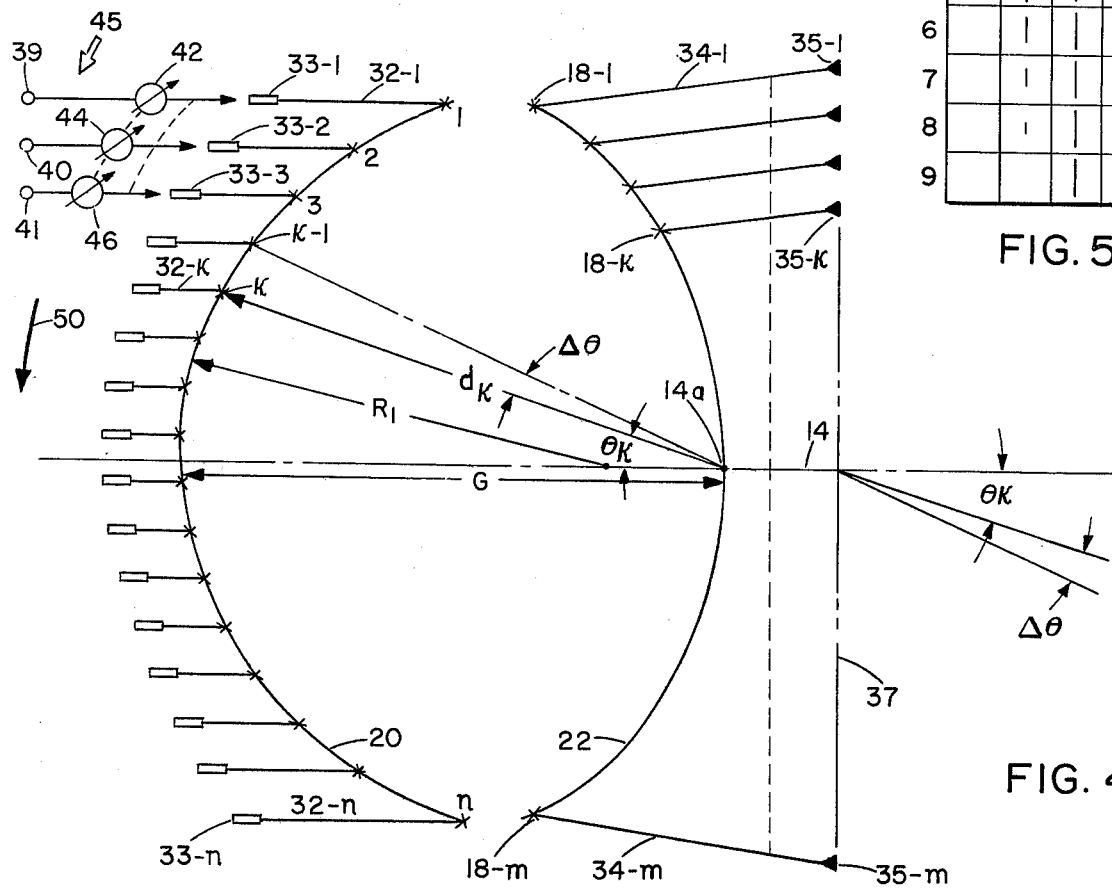
FIG. 5
FIG. 4

PHASING OPTIMIZATION AT THE FEED PROBES OF A PARALLEL PLATE LENS ANTENNA

RELATED PATENT APPLICATION

This application is related to a patent application entitled "Continuous Line Scanning Technique and Means for Beam Port Antennas" by A. I. Sinsky et al. having Ser. No. 752,657 and filed Dec. 20, 1976.

BACKGROUND OF THE INVENTION

This invention relates to wide-angle microwave lens for line source radar antenna applications and in particular to such lens which permit a resulting radiated beam to be scanned in small spaced increments while the array factor remains essentially constant.

Wide-angle microwave lens used as an antenna line source have been known for a long time. A typical such lens is comprised of a pair of flat parallel conducting plates whch comprise an RF transmission line fed by an input means of electromagnetic energy located on a focal arc, a plurality of coaxial transmission lines connected to output probes which extract energy from the parallel plate region, and a linear array of radiating elements fed individually by the coaxial transmission lines and radiating energy into space. As the input means is moved along the focal arc a resulting beam which is radiated by the radiating elements is scanned through a field of view. A wide-angle microwave lens antenna of this type has been described in U.S. Pat. No. 3,170,158 for "Multiple Beam Radar System" by Walter Rotman and in the technical paper "Wide Angle Microwave Lens for Line Source Applications" by Rotman and Turner on pages 623 to 632 of the November 1963 IEEE Transactions on Antennas and Propagation, and has come to be known as a Rotman lens antenna. It has been proposed to use a Rotman lens antenna in a microwave landing system (MLS) where the antenna is used to sweep a radiated beam through space at a known rate through known bounds. Thus, an aircraft periodically illuminated by the radiated beam could determine from the characteristics of the illumination its position in space with respect to the radiating antenna. If the radiated beam is swept horizontally then the aircraft could determine its azimuth with respect to the radiating antenna, while a beam swept vertically would provide elevation information to the aircraft, as known to those skilled in the art. Usually one antenna is arranged to sweep a beam horizontally and the other antenna is arranged to sweep a beam vertically, thus providing for practical purposes simultaneous azimuth and elevation information at an illuminated aircraft.

If the input means comprises a plurality of feed probes arranged along the focal arc and the various feed probes are energized so as to feed electromagnetic energy into the parallel plate region one at a time consecutively, the resulting beam will scan through space in distinct steps whose angular separation is directly related to the angular separation between adjacent feed probes. It is desirable, of course, that the aforementioned steps be as small as possible since positional uncertainty at the illuminated aircraft increases as the angular separation between consecutive beams, and hence distance between adjacent feed probes, increases. In short, a smoothly commutated beam provides the best degree of positional certainty at the illuminated aircraft, thus dictating relatively close feed probe spacing. However, if the feed probes are positioned too close to one another adjacent probes will be parasitic to an energized probe, thus distorting its resulting beam shape. One means of providing a well shaped smoothly commutating beam is through the use of a single feed probe instead of the above described plurality and physically moving the single probe along the focal arc of the lens. This type of scanning probe, however, introduces an undesirable mechanism to produce the mechanical motion.

In the aforementioned related patent application it was explained that a well shaped beam can be scanned through space in small steps by providing a plurality of feed probes along the focal arc of the antenna spaced so that the beam resulting from exciting any feed probe is orthogonal to the beam resulting from exciting an adjacent feed probe. A beam is then actually scanned through space by providing input power to the lens antenna through an adjacent number of feed probes simultaneously in accordance with a predetermined weighting schedule. As the weights are varied the beam scans through space.

It has been found that when using the invention of the aforementioned related patent application, it is possible to further improve the shape of the resulting scanned radiated beam by optimizing the phase of the energy supplied by the feed probes to the parallel plate region of the microwave lens antenna.

SUMMARY OF THE INVENTION

It is the object of the present invention to provide a relatively smoothly commutated scanning beam from a parallel plate lens antenna which has a relatively uniform shape over its entire scanning range. This is accomplished by adjusting the length of the coaxial cables supplying energy to the feed probes so as to optimize the phases of the energy signal at the feed probes.

BRIEF DESCRIPTION OF THE DRAWINGS

FIG. 1 is a plan view of a Rotman lens antenna.

FIG. 2 is a section taken along the longitudinal axis of the lens antenna of FIG. 1.

FIG. 3 shows the inside surface of one of the plates comprising a Rotman lens antenna including the feed and output probes.

FIG. 4 is a conceptual illustration of a Rotman lens antenna and is helpful in explaining the theory of this invention.

FIG. 5 illustrates the excitation level at various of the feed probes as the beam is commmutated.

DESCRIPTION OF THE PREFERRED EMBODIMENT

Refer to the drawings wherein like reference characters refer to like elements in the various figures except where noted otherwise. In FIGS. 1 and 2 there is seen a microwave lens of the parallel plate type having plates 10 and 12. A longitudinal axis 14 bisects the lens and it is a section along this axis that comprises the view of FIG. 2. Plates 10 and 12 are separated by end plates 24 and 26 at the feed side 16 and output side 19, respectively, of the parallel plate region, thus forming a closed cavity 30. End plates 24 and 26 are curved to follow parallel to focal arc 20 and output contour 22, respectively.

A plurality of feed probes 16, only one of which is shown in FIG. 2, are inserted in plate 10 along focal arc 20. Each feed probe 16 is comprised of an insulating sleeve 16b and an electrically conductive feed-through pin 16a, one end of which extends into cavity 30 and the other end of which is shown schematically connected via cable 32, suitably coaxial cable, to a connector 33. As known to those skilled in the art connectors 33 are joined to a source of energy at the appropriate microwave frequencies and the source power distributed or commutated to the various connectors 33 in accordance with the desired scanning direction of the resultant beam.

A plurality of output probes 18, only one of which is seen in FIG. 2, are inserted in plate 10 along output contour 22. The output probes are similar to the feed probes 16, each output probe 18 being comprised of an insulating sleeve 18b and an electrically conductive feed-through pin 18a, one end of which extends into cavity 30 and the other end of which is shown connected via cable 34, suitably coaxial cable, to an antenna radiating element 35. Elements 35 comprise a linear array of radiating elements or antennas which radiate a resulting beam into space. The outer conductors 32a and 34a, respectively, of coaxial cables 32 and 34 are connected in the conventional manner to a common signal return.

Refer now to FIG. 3 which is a plan view of cavity 30 of FIG. 2 with plate 12 removed. As seen, feed probes 16 are inserted through plate 10 along focal arc 20, while output probes 18 are inserted through plate 10 along output contour 22. End plates 24 and 26 are also seen.

Refer now to FIG. 4 where the microwave lens antenna cavity of the earlier figures is conceptualized as having focal arc 20 on radius $R_1$ and an output contour 22. Preferably, radius $R_1$ originates at longitudinal axis 14. Cables 34 and radiating elements 35 are also shown. For convenience, cables 32 and connectors 33 are given the suffixes $-l$ through $-n$ and the feed probes are numbered from $l$ to $n$, while output probes 18, cables 34 and radiating elements 35 are given the suffixes $-l$ through $-m$. It should be understood that the method of determining the shape of output contour 22, the lengths of cables 34 and the spacing of radiating elements 35 along line array 37 as well as radius $R_1$ are known to those skilled in the art and need not be repeated here. It is assumed that the feed probes are mutually orthogonal to one another. By that it is meant that if, for example, feed probe $k$ is excited with the appropriate microwave frequency so as to result in a radiated beam directed at an angle $\theta_k$ from longitudinal axis 14 and feed probe $k-l$ is excited so as to result in a radiated beam directed at an angle $\theta_{k-l}$ from the longitudinal axis and the nose of one beam coincides in space with a null of the other beam then the beams are said to be orthogonal and the feed probes whose excitation produces those beams are said also to be orthogonal. In the present embodiment, the feed probes are spaced along focal arc 20 so as to be orthogonal to one another and in particular so that the beam resulting from exciting one feed probe will have its nose coincide with the first null of a beam resulting from exciting an adjacent feed probe. Of course, if the feed probes are now energized or excited in turn by commutating an exciting signal along connectors 33 a beam will be scanned through space in discrete $\Delta\theta$ steps, where $\Delta\theta$ is the spacing between adjacent feed probes.

As described in the aforementioned related patent application, an antenna beam can be made to scan in smaller steps by commutating a weighted scanning function along the feed probes. One means for accomplishing this weighting function commutation is illustrated at 45 and includes input terminals 39, 40 and 41 for receiving an appropriate microwave frequency signal and attenuators 42, 44 and 46. Refer now also to FIG. 5 as an aid in explaining how the weighting function can be generated and commutated. In FIG. 5 the relative power exciting the various feed probes is represented by lines whose length is related to power level and which are tabulated against a timed sequence. For example, for means 45 in the position in FIG. 4 the attenuators are adjusted at sequence #1 to supply equal power to feed probes 1 and 2 and no power to the other feed probes. Through sequences #2 to #4 the power to feed probe #1 is decreased by manipulation of the attenuators and the power on feed probe #3 is correspondingly increased. This will cause the resulting beam to scan through the angle $\Delta\theta$ in a number of smaller steps. At sequence #5 the attenuators of means 45 are returned to their initial state (sequence #1) and the means moved one position in the direction of arrow 50 so that attenuator 46 feed connector 33-4. Thus, sequences #5 through #8 essentially repeat sequences #1 through #4 with means 45 moved one position.

The above described means 45 and its operation is deemed sufficient for an understanding of the present invention. In the aforementioned related patent application a somewhat different means 45 was used to distribute power to the various feed probes.

It should be noted that since the center of focal arc 20 does not coincide with the intersection of longitudinal axis 14 with the output contour 22, that is, at point 14a, the various feed probes are not uniformly distant from that point. It is desirable, however, that the signals injected into the parallel plate region by the various feed probes be coherent with one another as viewed from point 14a. In other words, considering the geometry of FIG. 4 and assuming the signal inputs into the various connectors 33 are coherent, then the phase shift through any cable 32 plus the phase shift between that cable's associated feed probe and point 14a must be equal to the phase shift through any other transmission path between any other connector 33 and point 14a. This can be accomplished, again referring to FIG. 4, by properly selecting the lengths of cables 32. In that FIG. G is the distance along longitudinal axis 14 between focal arc 20 and output contour 22 and $d_k$ is the distance between the $k^{th}$ feed probe and point 14a. The difference between these distances, $d_k - G$, must then be equivalent to a phase angle $\phi_k$ which is to be compensated for by cable 32 $-$ $k$. Phase angle $\phi_k$ is related to the known parameters of the antenna system as follows:

$$\frac{\phi_k}{(d_k - G)} = \frac{2\pi}{\lambda}$$

where $\lambda$ is the wavelength of the exciting energy. Rearranging terms:

$$\phi_k = \frac{2\pi}{\lambda}(d_k - G).$$

The proper electrical length of any cable 32 $-$ $k$ is thus equal to:

$$A + \phi_k$$

where A is a constant electrical length.

Having explained an embodiment of my invention the invention is to be limited only by the scope and true spirit of the appended claims.

The invention claimed is:

1. A radar antenna system having a microwave lens and including a linear array of radiating elements for radiating energy into space comprising a parallel plate wave conducting means having a longitudinal axis and including a plurality of feed probes located along the focal arc of said lens, a plurality of output probes located along the output contour of said wave conducting means and coupled to said radiating elements, a source of exciting energy for said feed probes and means connecting said source of exciting energy to said feed probes and having an electrical length equal to:

$$A + \frac{2\pi}{\lambda}(d_k - G)$$

where $\lambda$ is the wavelength of said exciting energy, G is the linear distance between the intersections of said longitudinal axis with said focal arc and said output contour, $d_k$ is the linear distance between the $k^{th}$ feed probe and the intersection of said longitudinal axis and said output contour, and A is a constant electrical length.

2. The radar antenna system of claim 1 wherein said feed probes are spaced on said focal arc so that the radiated beam produced by energizing a first of said feed probes is orthogonal to a radiated beam produced by energizing the feed probe adjacent to said first feed probe.

3. The radar antenna system of claim 2 wherein said parallel plate wave conducting means is symmetrical about a longitudinal axis and said predetermined point lies at the intersection of said output contour and said longitudinal axis.

4. A radar antenna system comprising a parallel plate wave conducting means having a longitudinal axis and an output contour and a plurality of feed probes located along a focal arc, a source of exciting energy for said feed probes and a plurality of coaxial cables connecting said source to said feed probes, the electrical lengths of said cables being $$A + \frac{2\pi}{\lambda}(d_k - G)$$

where $\lambda$ is the wavelength of said exciting energy, G is the linear distance between the intersections of said longitudinal axis with said focal arc and said output contour, $d_k$ is the linear distance between the $k^{th}$ feed probe and the intersection of said longitudinal axis and said output contour, and A is a constant electrical length.

5. The radar antenna system of claim 4 wherein said feed probes are spaced on said focal arc so that the radiated beam produced by exciting a first of said feed probes is orthogonal to a radiated beam produced by exciting the feed probe adjacent to said first feed probe.

6. The radar antenna system of claim 4 wherein a plurality of contiguous feed probes is excited simultaneously in accordance with a predetermined weighting schedule.

* * * * *